United States Patent [19]

Tatsumi et al.

[11] Patent Number: 5,180,464
[45] Date of Patent: Jan. 19, 1993

[54] DRY ETCHING METHOD

[75] Inventors: Tetsuya Tatsumi; Shingo Kadomura, both of Kanagawa, Japan

[73] Assignee: Sony Corporation, Tokyo, Japan

[21] Appl. No.: 644,014

[22] Filed: Jan. 22, 1991

[30] Foreign Application Priority Data

Jan. 22, 1990 [JP] Japan .................................. 2-10489
Feb. 27, 1990 [JP] Japan .................................. 2-47074

[51] Int. Cl.⁵ ...................... H01L 21/306; B44C 1/22
[52] U.S. Cl. .................................... 156/626; 156/643; 156/657; 156/662; 156/659.1; 252/79.1
[58] Field of Search ............... 156/643, 626, 646, 651, 156/652, 656, 657, 659.1, 662; 204/192.32, 192.33, 192.35, 192.37; 252/79.1

[56] References Cited

U.S. PATENT DOCUMENTS

| 4,444,617 | 4/1984 | Whitcomb | 252/79.1 X |
| 4,490,209 | 12/1984 | Hartman | 252/79.1 X |
| 4,528,066 | 7/1985 | Merkling et al. | 252/79.1 X |
| 4,997,520 | 3/1991 | Jucha et al. | 156/643 |
| 5,007,982 | 4/1991 | Tsou | 156/643 |
| 5,013,398 | 5/1991 | Long et al. | 252/79.1 X |

Primary Examiner—William A. Powell
Attorney, Agent, or Firm—Hill, Van Santen, Steadman & Simpson

[57] ABSTRACT

Disclosed is a dry etching method by which a polycide film consisting of a refractory metal silicide layer and a polysilicon layer are stacked one upon the other may be etched with high anisotropy, low pollution, high selectivity and high speed without using flon gases.

According to the method of the present invention, an etching gas containing a fluorine base gas mixed at least with HBr is used for etching the polycide film for realizing anisotropic processing under sidewall protection by a reaction product of mainly the resist material and Br.

Overetching for uniform processing in the wafer plane is performed with the use approximately solely of the fluorine base gas or HBr for realizing a high speed and improving substrate selectivity.

The overetching step is preceded by oxygen plasma treatment for oxidizing the reaction product and intensifying side wall protective effects while improving anisotropy.

Finally, the changes in the emission spectrum intensity during the etching are monitored for determining the end point of etching of the refractory metal silicide layer to enable more accurate setting of the etching conditions.

5 Claims, 6 Drawing Sheets

DRY ETCHING METHOD

BACKGROUND OF THE INVENTION

This invention relates to a method for dry etching and, more particularly, to a method for etching a polycide film used for, for example, a gate electrode, with high anisotropy and high substrate selectivity without using flon type gases.

As the gate wiring material for LSIs, polysilicon has been used extensively. However, with an increasing demand for a higher device operation speed, silicides of refractory metals have come into popular use, with which a resistance value about one digit lower than that with the polysilicon may be achieved. When forming a gate wiring layer by using silicides of refractory metals, the recent tendency is to use a so-called polycide film, that is, to deposit a layer of silicides of refractory metal on a gate insulating film by the interposition of doped polysilicon layer (DOPOS layer) instead of directly depositing the silicide layer on the gate insulating film. In this manner, the resistance of the gate wiring material may be lowered by the deposition of the refractory metal silicide layer on the polysilicon layer, a proven wiring material, which is applied to an interface with the gate insulating film which tends to affect the device characteristics and reliability most seriously.

However, with such polycide film, difficulties have been newly raised in connection with dry etching, since it is required of the polycide film to present anisotropy with respect to both of two different types of materials. That is, due to the difference in vapor pressures of the halogen compounds yielded during the etching of the polycide film, the lower DOPOS layer is etched more quickly than the upper refractory metal silicide layer, or a reactive layer is produced at the interface between the DOPOS layer and the refractory metal silicide layer, with the result that undercuts or distortions may be produced in the pattern.

For example, in the case of a substrate in which, as shown in FIG. 6(A), a polycide film 15 consisting of a DOPOS layer 13 and a refractory metal silicide layer 14 is deposited on a silicon substrate 11 with the interposition of an insulating film 12 of, for example, silicon oxide, when the polycide film 15 is to be etched with a resist pattern 16 as a mask, shape abnormalities such as are shown for example in FIG. 7 may be experienced frequently. That is, an undercut 17 is produced below the refractory metal silicide pattern 14a formed anisotropically below the resist pattern 16, such that the produced DOPOS pattern 13d is of a width which is narrower than the desired pattern width.

These shape abnormalities cannot be tolerated especially with submicron devices since an offset region devoid of impurities may be formed during ion implantation for forming the source-drain region, or dimensional accuracy in the course of side wall formation for realizing an LDD structure may be lowered.

For realizing anisotropic etching, it may be contemplated to i) raise an ionic energy, ii) add a deposition gas to an etching gas system to produce a mixed gas to be used for side wall protection or iii) to produce a reaction product of an etched material and an etching gas and to use the reaction product for side wall protection. However, these measure are not without their demerits. That is, increase in the ion energy gives rise to recession of the resist or to damages, whereas addition of the deposition gas to the etching gas system results in pollution by particles. On the other hand, with side wall protection by the reaction product, uniform patterns cannot be produced since the effect of side wall protection is changed with the size of the etched area. Practically useful anisotropic etching cannot be realized unless these problems are overcome simultaneously.

An etching gas consisting mainly of a Flon base gas, such as Flon 113 ($C_2Cl_3F_3$), has been used most extensively as the etching gas for a polycide film, as reported for example in "Semiconductor World", edited by Press Journal, October issue, 1989, pages 126 to 130. Since this gas contains both fluorine and chlorine atoms in its molecules, the etching reaction may proceed effectively in both the radical and ion modes, at the same time that highly anisotropic etching becomes possible as side wall protection is assured simultaneously by deposition of the carbon base polymer.

However, the Flon gases have been pointed out as causing destruction of an ozone layer surrounding the earth, and hence the manufacture as well as the use of the gas is to be prohibited in the near future. Thus it is incumbent in the field of dry etching to find a suitable substitute material for the Flon gases and to establish the technology of effective utilization of the substitute material.

It is also incumbent in the field of polycide film etching to establish high selectivity with respect to the etching base.

For example, for employing the polycide film for formation of a gate wiring, the etching base is frequently a silicon oxide layer for providing a gate insulating film. This silicon oxide layer should operate as a stop for etching. Recently, the film thickness of the gate insulating film has been reduced to an increasing degree and, since an overetching is usually practiced during the etching process for removing etching residues for the reason which will be explained subsequently, a process exhibiting superior etching base selectivity is indispensable.

The reason why the overetching needs to be practiced is hereinafter explained with reference to FIGS. 6(A) and 6(B). For example, with on etching the substrate shown for example in FIG. 6(A), etching residues 13b, 13c may be produced at the time point when the majority of the polycide film 15 has been etched and the refractory metal silicide pattern 14a and the DOPOS pattern 13a have been formed. These etching residues are produced to a more or less extent due to fluctuations in the etching conditions or in-plane nonuniformities of the etched material. Although not shown, when the polycide film is formed on a substrate having a step or steps, etching residues tend to be formed on the step or steps. These etching residues need to be removed by overetching. However, high selectivity is required because of the extremely thin thickness of the insulating film 12 as the etching base.

Recently, HBr has attracted attention as an etching gas in view of the demand for reducing the size of the device, finding a suitable substitute material for Flon gas and improving the etching base selectivity. For example, in "Digest of Papers, 1989, Second Microprocess Conference", page 190, a report is made of an example in which a satisfactory shape anisotropy has been realized by reactive ion etching of the n+ type DOPOS layer with the use of HBr. It is difficult with Br to produce a spontaneous etching reaction since Br has a larger atomic radius and is unable to invade easily into the crystal lattices or into the grain boundary of the etched material. However, it is possible with Br to produce an etching reaction when ion bombardment is accompanied so that Br may provide etchants useful for achieving the desired anisotropy. For this reason, various attempts have been made to use Br etchants and to set the bias power to an optimum value to procure a high selectivity with respect to the gate oxide film as the etching base for achieving satisfactory anisotropic etching.

It has however become apparent that, although successful results have been obtained to some extent with dry etching by HBr in connection with anisotropic etching of the DOPOS layer and etching base selectivity, the following disadvantages have been experienced on application of the dry etching by HBr to etching of the silicide film. That is, the etching chamber may be contaminated by refractory metal bromides sputtered out during etching of the refractory metal silicide layer and, since Br base radicals used as the etchant are intrinsically low in reactivity, the etching rate is drastically lowered as compared to that of etching with the use of the conventional Flon gases.

SUMMARY OF THE INVENTION

It is a principal object of the present invention to provide a method for high-speed dry etching of the polycide film which, without using flon gases, exhibits superior substrate selectivity and shape anisotropy and low-pollution characteristics and which enables determination of the boundary between the refractory metal silicide layer and the polysilicon layer.

The present invention has been proposed for attainment of the above object.

In its first aspect, the present invention provides a method for dry etching of a polycide film consisting of a refractory metal silicide layer and a polysilicon layer, wherein the improvement resides in that the polycide film is etched with the use of an etching gas containing a fluorine base gas mixed at least with HBr.

In its second aspect, the present invention resides in the dry etching method which is characterized by comprising a first step of etching as in the first aspect and a second step of overetching with HBr.

In its third aspect, the present invention is characterized by using, during the second etching step in the above mentioned second aspect, a fluorine base gas in place of HBr.

In its fourth aspect, the present invention is characterized by comprising a first step of etching as in the above described first aspect, a second step of oxygen plasma treatment, and a third step of overetching.

In its fifth aspect, the present invention provides a dry etching method for a polycide film as in the above mentioned first aspect, wherein the improvement resides in that the end point of etching of the refractory metal silicide layer is determined by monitoring changes in the emission spectrum intensities.

In the first aspect of the present invention, an etching gas containing a fluorine base gas admixed with at least HBr is employed. With this gas system, etching may proceed at a practically useful speed by fluorine radicals generated by electrical discharge, while the effects of sidewall protection by the reaction product between mainly the resist material layer and Br may also be expected for realization of high anisotropy.

In the second aspect, after the end of the etching of the polycide film by the above mentioned gas system, overetching is carried out with the use substantially solely of HBr. In this manner, while high selectivity with respect to the gate oxide film is maintained, the polycide film, above all, the polysilicon layer, may be eliminated completely on the overall wafer surface without lowering the etching rate for the process in its entirety.

In the third aspect, conversely to the second aspect, overetching is carried out with the use substantially of the fluorine base gas. In this manner, the overetching rate may be raised significantly.

In the fourth aspect, the overetching is preceded by oxygen plasma treatment of the substrate. This processing allows labile constituents in the previously formed sidewall protective film to be oxidized readily to intensify sidewall protective effects as well as to improve shape anisotropy.

In the fifth aspect, during etching of the polycide film, the boundary or interface between the refractory metal silicide layer and the polysilicon layer is determined by detecting the decrease in the emission spectrum intensity in the vicinity of the boundary which is thought to be ascribable to the decrease in etchant consumption. This enables the etching conditions to be controlled more intensively.

BRIEF DESCRIPTION OF THE DRAWINGS

FIGS. 1(A) and 1(B) are diagrammatic cross-sectional views showing, step by step, the method for dry etching according to an embodiment of the present invention, wherein FIG. 1(A) shows the step of forming a photoresist pattern and FIG. 1(B) shows the step of etching a polycide film.

FIGS. 6(A) and 6(B) are diagrammatic cross-sectional views showing the state of generation of etching residues in the course of dry etching of the polycide film, wherein FIG. 6(A) shows the state of the substrate before start of etching and FIG. 6(B) shows the state of the substrate after etching.

DETAILED DESCRIPTION OF THE INVENTION

Figure 1A:
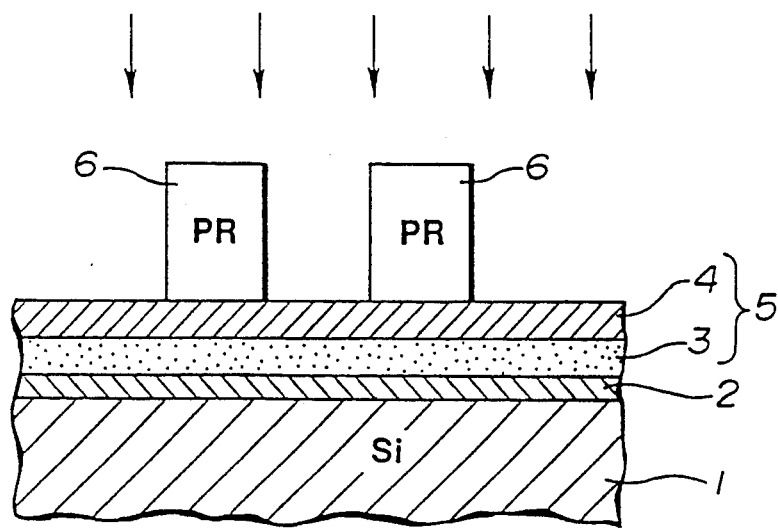

In accordance with the dry etching method of the present invention, the etching reaction may proceed in such a manner as to make the best use of the merits of a fluorine base gas and HBr in etching the polycide film consisting of the refractory metal silicide layer and the polysilicon layer.

Assuming that, during dry etching of the polycide film, the aforementioned fluorine base gas is used alone, the reaction product of the polysilicon layer and the fluorine base radicals is eliminated promptly, due to the high vapor pressure of the reaction product, at the time point when the cross-section of the polysilicon layer is exposed. Thus the relative etching rate of the polysilicon layer becomes higher than that of the refractory metal silicide layer and hence, in a majority of cases, undercuts are produced in the polysilicon layer.

If, on the other hand, HBr is used alone, the etching rate is drastically lowered because of the deposition of the reaction products of the resist material and Br and the fact that yielded Br base radicals are chemical species unsusceptible to spontaneous reactions with the refractory metal silicide layer or with the polysilicon layer. Also the process would not be practically useful since bromides of the refractory metals are yielded during etching of the refractory metal silicide layer to give rise to pollution by particles.

If, however, an etching gas consisting of a mixture of at least the fluorine base gas and HBr at a suitable mixing ratio is employed, as in the first aspect of the present invention, the above mentioned deficiencies may be obviated satisfactorily. That is, the practically useful level of the etching rate may be procured with the highly reactive fluorine base gas. On the other hand, the resist material is effectively sputtered out by Br with the large mass to form a reaction product, which then is deposited, along with, for example, $SiBr_x$, on the side wall section of the polycide pattern, with the result that undercuts may be prevented from being formed in the polysilicon layer. In addition, H in HBr functions to contribute to decomposition of the resist material or to the capturing of excess fluorine base radicals in the system and elimination thereof in the form of hydrofluoric acid. Besides, since the deposition gases are not used in the etching system, there is no risk that particles be produced from the gaseous phase to pollute the etching chamber. Thus, with the first aspect of the present invention, anisotropic etching may be realized at a high speed and under a pollution-free condition.

In the second aspect of the present invention, after the etching of the polycide film has been substantially completed by the above described process as the first etching step, an overetching is performed as the second etching step with the use substantially solely of HBr. In this manner, removal of the polycide film may be terminated completely while a high selectivity is maintained with respect to the gate oxide film as the etching base. Since the major portion of etching is completed at the first etching step, the overall etching rate is not drastically lowered. Since HBr is used alone, selectivity with respect to the gate insulating film composed of, in general, silicon oxide, is also improved. The reason is that, as may be expected from the relative magnitude of the interatomic bonding energies of Si—O > Si—Br, silicon oxide is theoretically not substantially etched by HBr if the effect of ion sputtering is disregarded. In addition, since the refractory metal silicide layer is absent at the second etching step, there is no risk of pollution by particles due to bromides of the refractory metals, even if HBr is used alone.

In the third aspect of the present invention, overetching is performed substantially with the use of the fluorine base gas alone to eliminate the polycide film at a high speed without drastically lowering the etching base selectivity. In the third aspect of the present invention, as may be anticipated from the relative magnitudes of the interatomic bonding energies of Si—F > Si—Br, selectivity with respect to silicon oxide in the third aspect is somewhat inferior to that in the second aspect. However, the etching rate is excellent because the overetching by mainly the fluorine radicals is performed. Shape anisotropy is naturally maintained because the sidewall protective film is already formed on the pattern sidewall in the course of the preceding etching step.

In the fourth aspect of the present invention, oxygen plasma treatment is carried out before overetching. By this processing, labile $SiBr_x$ deposited on the side wall of the pattern as the etching reaction product is oxidized readily to enhance the side wall protective effects to permit satisfactory anisotropic processing.

In the fifth aspect of the present invention, with attention directed to the fact that the intensity of the emission spectrum is decreased in the course of dry etching of the polycide film with the use of the etching gas containing the fluorine base gas and HBr, such change in the emission spectrum intensity is utilized for determining the boundary or interface between the refractory metal silicide layer and the polysilicon layer. While it is known that the emission efficiency of a halide of tungsten, a typical refractory metal, is very low, it is in general extremely difficult to determine the etching end point of the refractory metal silicide layer on the basis of the light emission specific to the reaction product derived from this layer. However, with the present fifth aspect, it becomes possible to determine the interface by monitoring the decrease in the light emission intensity at a particular wavelength range thought to be ascribable to changes in etchant consumption. In this manner, it becomes possible to control the etching conditions more intensively. For example, since the polysilicon layer exhibits higher reactivity with respect to fluorine radicals than the refractory metal silicide layer, more intensive anisotropic processing may be realized by raising the percentage of HBr in the etching gas after locating the above mentioned boundary. On the other hand, since the refractory metal silicide layer frequently undergoes delicate fluctuations in composition depending on the type of the film forming device employed, it becomes necessary to optimize the fluorine base gas to HBr mixing ratio correspondingly. However, since the mixing ratio is not necessarily optimum for etching the polysilicon layer, the above mentioned boundary may be advantageously employed as a measure for setting the timing of changing the composition of the etching gas.

The present invention will be hereinafter explained with reference to several preferred examples which are not given in the sense of limiting the invention.

EXAMPLE 1

In the present example 1, the first aspect of the present invention is applied to etching a polycide film which is to be a gate electrode. The present etching proces will be explained by referring to FIGS. 1(A) and 1(B).

Referring first to FIG. 1(A), a gate oxide film 2 formed of, for example, silicon oxide, a DOPOS layer 3, forming a lower layer of a polycide film 5, and a tungsten silicide layer 4, forming an upper layer of the polycide film 5, were stacked sequentially on a semiconductor substrate 1 formed of, for example, a single crystalline silicon. Then, on the surface of the tungsten silicide layer, a photoresist pattern 6 was selectively formed as an etching mask for the polycide film 5.

Figure 1B:
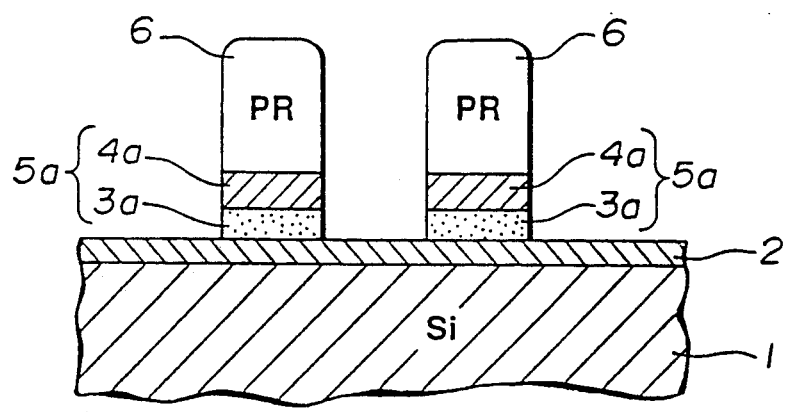

The resulting substrate assembly, shown in FIG. 1(A), was placed in a parallel flat plate type reactive ion etching (RIE) apparatus to carry out etching under the conditions of the $SF_6$ flow rate of 20 SCCM, the HBr flow rate of 10 SCCM, the gas pressure of 1.0 Pa or 7.5 mToor and the RF power of 300 W. Under these conditions, the etching reaction mainly based on the radical reaction proceeded quickly and, under formation of a small amount of the sidewall protective film, not shown, on at least the side wall of the polycide film 5, a gate electrode having a pattern width of 0.35 µm was formed with satisfactory shape anisotropy, as shown in FIG. 1(B). Damages were prevented from occurring due to the lower ion incident energy under these conditions which is in the order of 250 V. It may be contemplated that the sidewall protective film consists of a mixture formed by the major portion of a carbonaceous polymer yielded by sputtering the photoresist pattern 6 with Br and the minor portion of, for example, $SiBr_x$. The overall process was extensively pollution-free because deposition gases were not contained in the above described etching gas and hence particles were scarcely formed in the gaseous phase and also because pollution due to bromides of the refractory metals was precluded.

Although $SF_6$ was used in the above example as the fluorine base gas, $NF_3$, $ClF_3$, $F_2$ or HF, for example, may also be employed. The mixing ratio of HBr to these fluorine base gases is preferably in the order of 1 to 50 mol percent. If the mixing ratio is lesser than the above range, the sidewall protective effect falls short, whereas, if the mixing ratio is higher than the above range, the etching rate may be lowered.

The sidewall protective effect may be intensified by suitably adding $N_2$ or $O_2$ to the etching gas so that a reaction product of these gases with Si will go into the composition of the sidewall protective film. Rare gases, such as argon or helium, may also be added in expectation of sputtering, dilution and cooling effects.

Although tungsten silicide was employed in the above example as the refractory metal silicide constituting the upper layer of the polycide film 5, silicides of refractory metals other than tungsten, such as molybdenum, titanium or tantalum, may also be employed as the refractory metal silicides.

EXAMPLE 2

In the present example 2, overetching by HBr was carried out in succession to the etching in the preceding example 1, in accordance with the second aspect of the present invention.

Thus the polycide film 5 was etched to the state of completion of the etching shown in FIG. 1(B), as the first step, under the conditions specified in example 1. The supply of $SF_6$ was then terminated and the flow rate of HBr was adjusted to 30 SCCM to carry out the second step (overetching step). Because of higher selectivity with respect to the gate oxide film 2 in the second step than that in the first step, only the residual DOPOS layer was effectively removed without damaging the etching base. In this manner, uniform etching could be achieved throughout the inside of the wafer. On the other hand, pollution by particles was not caused by the second step. In addition, the second step was completed in a shorter time without protracting the total etching time.

EXAMPLE 3

In the present example 3, overetching by $SF_6$ was carried out in succession to the etching by the $SF_6$/HBr system, in accordance with the third aspect of the present invention.

The substrate to be etched was the same as that shown in FIG. 1(A). This substrate was set in a microwave plasma etching device having a magnetic field and the polycide film 5 was etched to a depth substantially equal to its film thickness under conditions of the $SF_6$ flow rate of 20 SCCM, HBr flow rate of 30 SCCM, gas pressure of 0.67 Pa (=5 mToor), microwave power of 850 W and the RF bias power of 100 W at 13.56 MHz. The etching rate of the DOPOS layer under these conditions was 7700 Å/min.

The supply of HBr was then terminated and the $SF_6$ flow rate was adjusted to 50 SCCM to carry out overetching. The etching proceeded at the speed of 15200 Å/min which is about double the above mentioned etching rate, thus resulting in the shortened overetching time and improved throughput.

Although it may be feared that the etching base selectivity may be lowered as a result of using $SF_6$ alone, this problem can be coped with by terminating or decreasing the impression of the RF bias power during overetching. The reason is that, when the RF bias power and hence the incident energy of the ions are lowered, the etching rate for silicon oxide is lowered, whereas that for the silicon material, such as DOPOS, is scarcely changed. It may be contemplated that then etching for the silicon material proceeds by fluorine radicals and hence is dependent on the RF bias power to a lesser degree than the ion-assisted etching for silicon oxide. Thus it becomes possible to carry out the overetching under suppression of the etching of the gate oxide film 2. Etching with $SF_6$ alone from the outset results in undercuts, whereas overetching with the HBr/$SF_6$ system in succession leads to the inconvenience that the etching rate cannot be increased.

EXAMPLE 4

In the present example 4, the oxygen plasma treatment was interposed between the etching and the overetching of the polycide film 5 in accordance with the fourth aspect of the present invention.

In the first step, anisotropic etching was carried out with the $SF_6$/HBr etching gas system until the end of the former etching step described in example 3. The etching conditions until this time may be the same as those used in the preceding example 3.

As the second step, microwave discharge was carried out for 5 seconds under the conditions of the oxygen gas flow rate of 50 SCCM, microwave power of 850 W and the RF bias power of 0 W, by way of performing the oxygen plasma treatment. While it is known to achieve sidewall protection by oxidizing the sidewall, it may be premeditated that, in the process of the present example 3, the reaction product $SiBr_x$ adhered to the sidewall of the etched pattern is chemically labile to a larger extent and may be oxidized readily to achieve more efficient sidewall protection.

Then, as the third step, overetching was performed with the use of HBr. The overetching conditions of the HBr gas flow rate of 50 SCCM, microwave power of 510 W and the RF bias power of O W were employed. In this manner, the pattern of the polycide film 5 was formed with satisfactory shape anisotropy, as shown in FIG. 1(B).

Meanwhile, $SF_6$ may also be employed instead of HBr for overetching.

EXAMPLE 5

In the present example 5, changes in the emission spectrum intensities during etching were monitored in accordance with the fifth aspect of the present invention.

In the present example, the etching end point of the tungsten silicide layer 4 was determined on the basis of changes in the emission spectrum intensities appearing between 450 nm and 650 nm with the use as the etching gas of a gas mixture consisting mainly of a gas which easily yields at least fluorine radicals and also containing HBr.

First, the substrate shown in FIG. 1(A) was etched under the same conditions as those for the former half of the etching shown in example 3.

Figure 3:
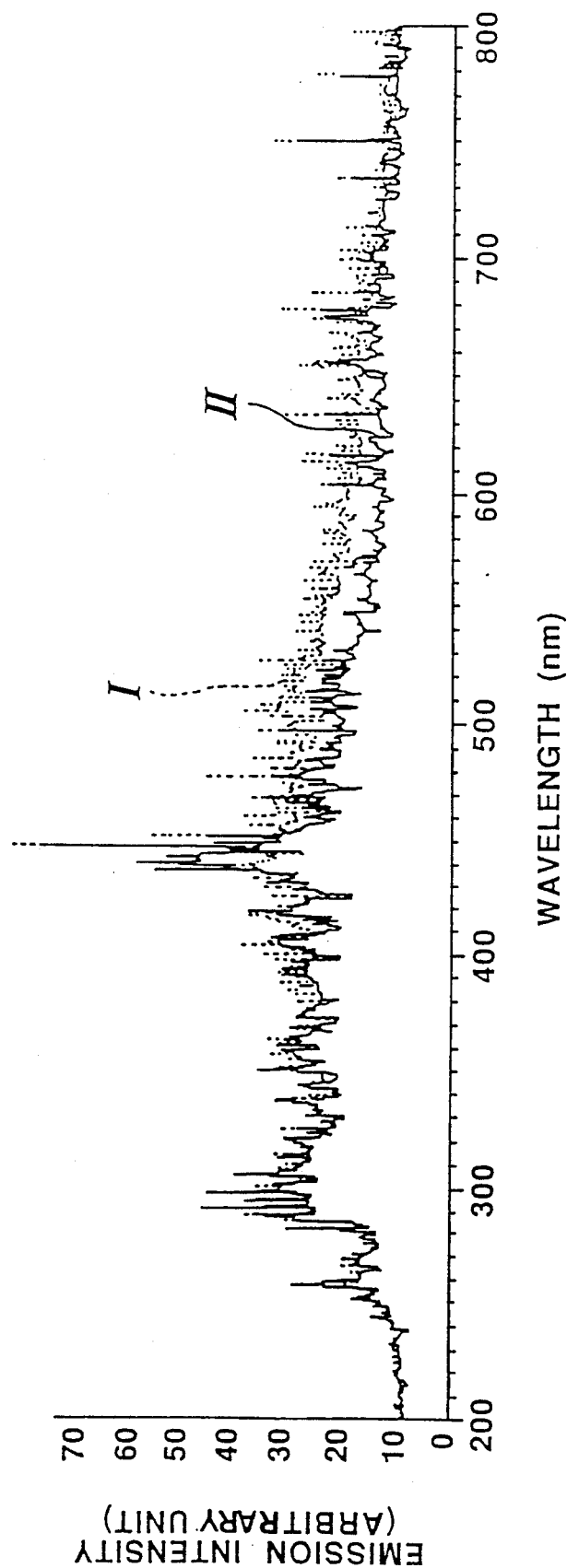
FIG. 3 is an emission spectrum showing, as an example of locating the etching end point for the refractory metal silicide layer according to the present invention, the emission spectrum when the tungsten silicide layer and the polysilicon layer are etched by an $SF_6$/HBr system.

FIG. 3 shows the emission spectrum in the case of etching of each of the tungsten silicide layer 4 and the DOPOS layer 3. In this figure, the ordinate and the abscissa stand for emission intensity in arbitrary unit and the wavelength in nm, respectively, whereas the spectrum I and the spectrum II stand for the emission spectrum for etching the tungsten silicide layer 4 and that for etching the DOPOS layer 3, respectively.

Figure 4:
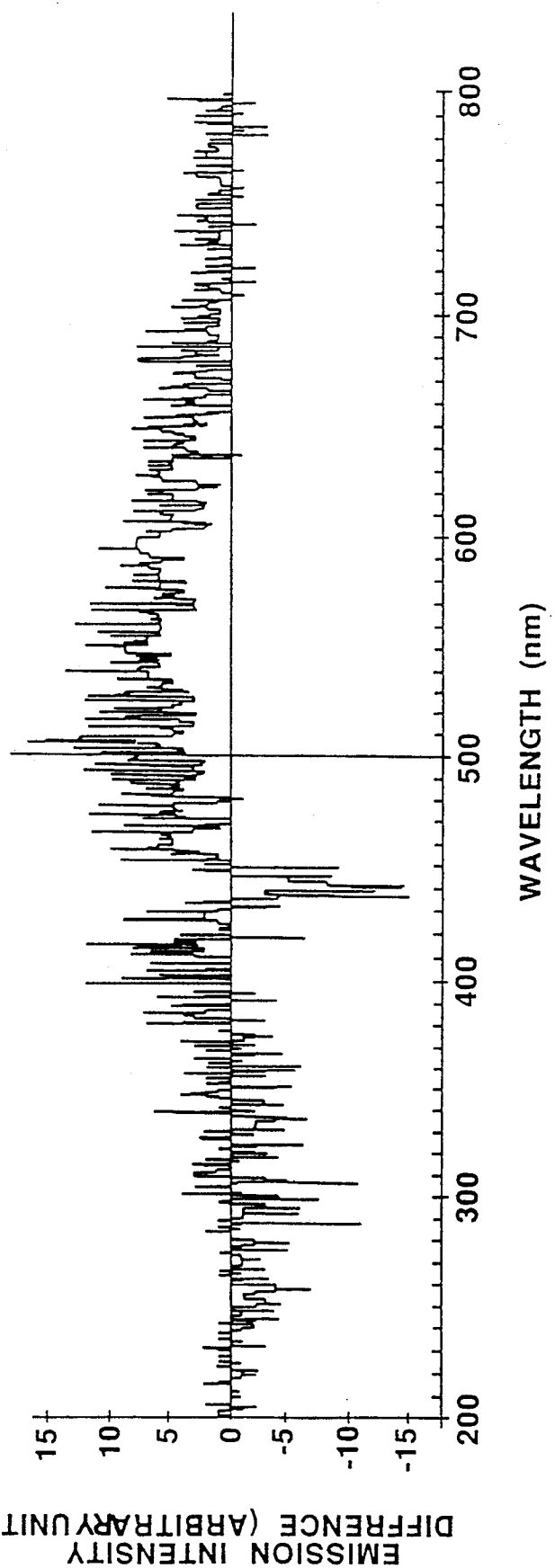
FIG. 4 shows the differential spectrum in the emission spectrum shown in FIG. 3.

FIG. 4 shows the spectrum difference, that is, spectrum corresponding to the emission spectrum I for the etching of the tungsten silicide layer 4 less the emission spectrum II for the etching of the DOPOS layer 3. In this figure, the region above the centerline represents the region in which the emission intensity becomes higher during etching of the tungsten silicide layer 4, whereas the region below the centerline represents the region in which the emission intensity becomes higher during etching of the DOPOS layer 3.

It is seen from these figures that the emission intensity is lowered on the whole with respect to a wide wavelength range of 450 to 650 nm during etching of the DOPOS layer 3 than during etching of the tungsten silicide layer 4.

Although the details such as light emitting chemical species are not known, it may be inferred that, since the emission intensity becomes lower during the etching of the polysilicon layer which proceeds with the faster etching rate, the light emission in the above described wavelength is not attributable to the etching reaction product, but to the etchant, and that the above described lowering of the emission intensity is attributable to increased etchant consumption.

Figure 2:
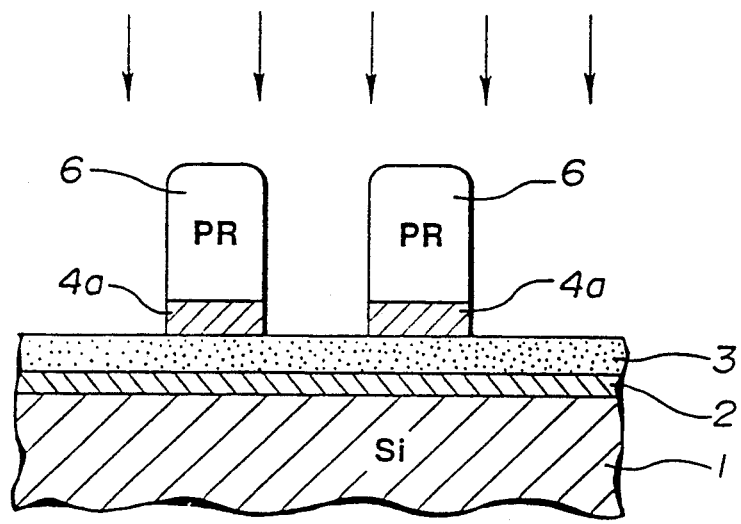
FIG. 2 is a diagrammatic cross-sectional view showing the state of the substrate at the time point when etching of the tungsten silicide layer is terminated in the course of etching of the polycide film.
Figure 7:
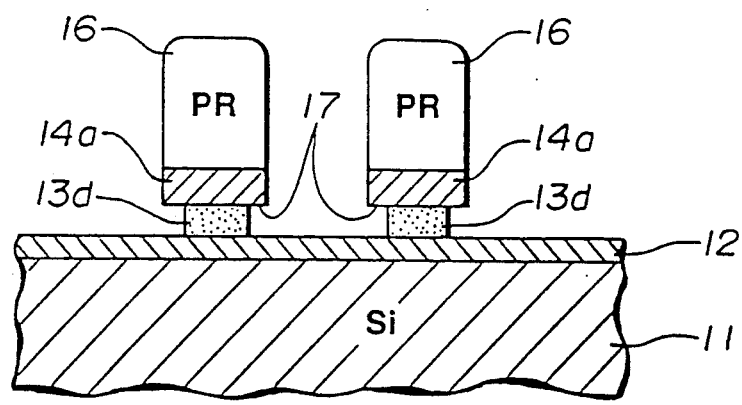
FIG. 7 is a diagrammatic cross-sectional view showing the state in which an undercut is produced in the DOPOS pattern in the conventional dry etching process for the polycide film.
Figure 5:
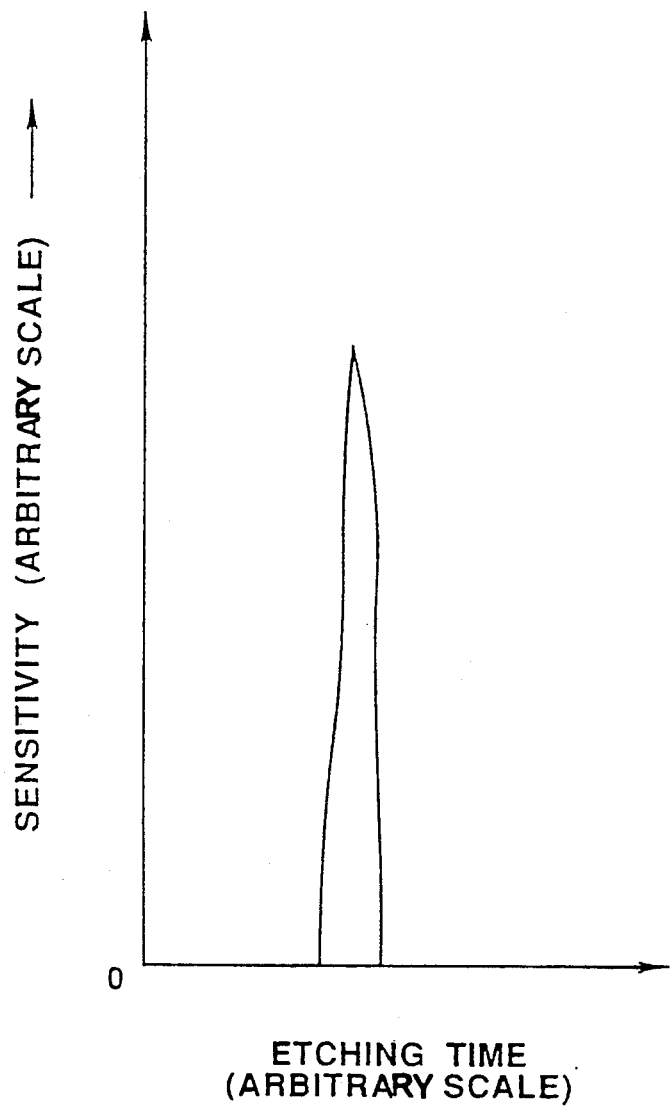
FIG. 5 is a chart showing temporal changes of the emission intensity at 519 nm in the emission spectrum shown in FIG. 3.
Figure 6:
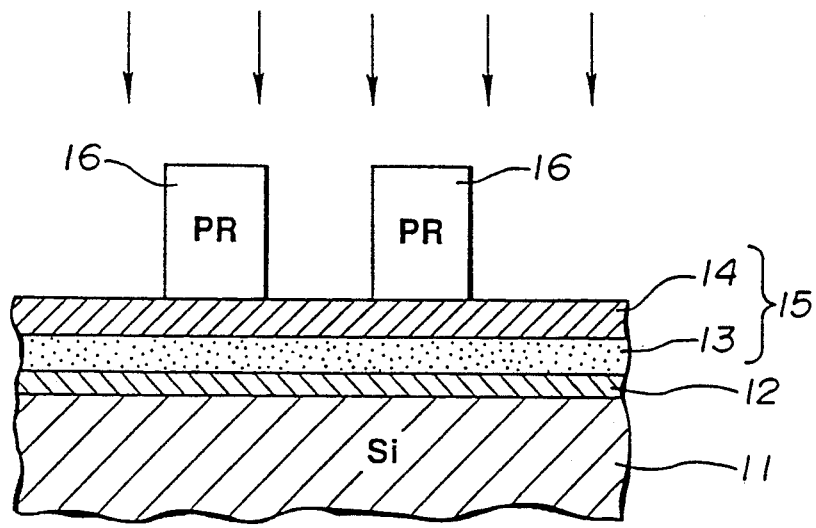
Figure 6:
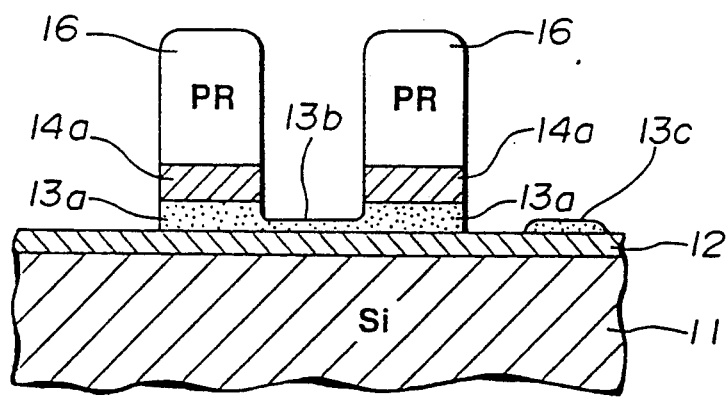

By way of an example, temporal changes in the emission intensity at the wavelength of 519 nm are shown magnified in the chart of FIG. 5, wherein the ordinate and the abscissa represent the sensitivity and the etching time, both in the arbitrary scale, respectively. The etching of the tungsten silicide layer 4 was substantially terminated in 30 seconds after the start of the etching. The status of the substrate at this time point is as shown for example in FIG. 2. Such determination of the boundary surface is effective for altering the optimum etching conditions for etching the tungsten silicide layer 4 and the DOPOS layer 3 when it is desired to carry out etching of these layers with alteration of the respective optimum etching conditions.

Although the emission line used for end point determination was set to 519 nm in FIG. 5, any other wavelength enabling the difference in the emission intensity to be ascertained, such as 505 nm or 539 nm, may also be employed.

What is claimed is:

1. A method for dry etching of a polycide film consisting of a refractory metal silicide layer and a polysilicon layer, wherein the improvement resides in that said polycide film is etched with the use of an etching gas containing a fluorine base gas mixed with at least HBr.

2. A method for dry etching of a polycide film consisting of a refractory metal silicide layer and a polysilicon layer, wherein the improvement resides in that the method comprises the first step of etching said polycide film with the use of an etching gas containing a fluorine base gas mixed with at least HBr, and the second step of overetching with the use of HBr.

3. A method for dry etching of a polycide film consisting of a refractory metal silicide layer and a polysilicon layer, wherein the improvement resides in that the method comprises the first step of etching said polycide film with the use of an etching gas containing a fluorine base gas mixed with at least HBr, and the second step of overetching with the use of a fluorine base gas.

4. A method for dry etching of a polycide film consisting of a refractory metal silicide layer and a polysilicon layer, wherein the improvement resides in that the method comprises the first step of etching said polycide film with the use of an etching gas containing a fluorine base gas mixed with at least HBr, the second step of oxygen plasma treatment, and the third step of overetching.

5. A method for dry etching of a polycide film consisting of a refractory metal silicide layer and a polysilicon layer, wherein the improvement resides in that said polycide film is etched with the use of an etching gas containing a fluorine base gas mixed with at least HBr, and in that the end point of the etching of said refractory metal silicide layer is determined by monitoring changes in the emission spectrum intensity.

* * * * *